United States Patent
Roh et al.

(10) Patent No.: US 9,847,621 B2
(45) Date of Patent: Dec. 19, 2017

(54) APPARATUS FOR OUTPUTTING DIRECTIONAL LIGHT AND LIGHT INTERCONNECTION SYSTEM HAVING THE SAME

(71) Applicant: SAMSUNG ELECTRONICS CO., LTD., Suwon-si (KR)

(72) Inventors: Younggeun Roh, Seoul (KR); Sangmo Cheon, Bucheon-si (KR); Unjeong Kim, Hwaseong-si (KR); Jineun Kim, Suwon-si (KR); Yeonsang Park, Seoul (KR); Changwon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 320 days.

(21) Appl. No.: 14/530,015

(22) Filed: Oct. 31, 2014

(65) Prior Publication Data
US 2015/0117015 A1    Apr. 30, 2015

(30) Foreign Application Priority Data
Oct. 31, 2013   (KR) .................. 10-2013-0131503

(51) Int. Cl.
| | |
|---|---|
| F21V 13/08 | (2006.01) |
| F21V 7/00 | (2006.01) |
| F21V 8/00 | (2006.01) |
| H01S 5/183 | (2006.01) |
| H01L 33/02 | (2010.01) |
| H01L 33/44 | (2010.01) |

(Continued)

(52) U.S. Cl.
CPC .......... *H01S 5/18391* (2013.01); *H01L 33/02* (2013.01); *H01L 33/44* (2013.01); *B82Y 20/00* (2013.01); *G02B 6/107* (2013.01); *H01L 33/38* (2013.01); *H01S 5/041* (2013.01); *H01S 5/18383* (2013.01); *H01S 5/423* (2013.01)

(58) Field of Classification Search
CPC .. H01S 5/18391; H01S 5/18383; H01S 5/423; H01S 5/041; H01L 33/02; H01L 33/36; H01L 33/38; H01L 33/385; H01L 33/44; B82Y 20/00; G02B 6/107
See application file for complete search history.

(56) References Cited

U.S. PATENT DOCUMENTS

| | | | | |
|---|---|---|---|---|
| 7,057,151 | B2 * | 6/2006 | Lezec | .......... B82Y 20/00 250/216 |
| 8,086,108 | B2 * | 12/2011 | Tanigawa | .......... H04J 14/06 257/82 |

(Continued)

FOREIGN PATENT DOCUMENTS

| KR | 10-2012-0138903 A | 2/2001 |
|---|---|---|
| KR | 10-0945989 B1 | 3/2010 |
| KR | 10-2012-0085027 A | 7/2012 |

*Primary Examiner* — Alan Cariaso
(74) *Attorney, Agent, or Firm* — Sughrue Mion, PLLC

(57) ABSTRACT

An apparatus for outputting directional light includes a light-emitting structure including a light-emitting layer that emits light, and an optical antenna layer disposed on the light-emitting structure, wherein the optical antenna layer includes a light feeder configured to resonate light output from the light-emitting layer and a light reflector configure to reflect light output from the light feeder to have directivity. The light feeder and the light reflector are formed on a surface of the optical antenna layer.

15 Claims, 10 Drawing Sheets

(51) Int. Cl.
   *B82Y 20/00*  (2011.01)
   *G02B 6/10*   (2006.01)
   *H01L 33/38*  (2010.01)
   *H01S 5/04*   (2006.01)
   *H01S 5/42*   (2006.01)

(56) References Cited

U.S. PATENT DOCUMENTS

| | | | | |
|---|---|---|---|---|
| 8,304,796 | B2* | 11/2012 | Fukuda | H01L 51/5265 |
| | | | | 257/98 |
| 8,328,396 | B2* | 12/2012 | Capasso | B82Y 20/00 |
| | | | | 359/641 |
| 8,446,094 | B2* | 5/2013 | Niigaki | H01J 31/48 |
| | | | | 313/103 R |
| 2008/0024873 | A1 | 1/2008 | Kim et al. | |
| 2012/0025184 | A1 | 2/2012 | Naya et al. | |
| 2012/0025185 | A1 | 2/2012 | Kasamatsu | |
| 2012/0220471 | A1 | 8/2012 | Gomez Rivas et al. | |
| 2012/0300202 | A1* | 11/2012 | Fattal | G01N 21/658 |
| | | | | 356/301 |
| 2013/0070459 | A1 | 3/2013 | Kim et al. | |

* cited by examiner

APPARATUS FOR OUTPUTTING DIRECTIONAL LIGHT AND LIGHT INTERCONNECTION SYSTEM HAVING THE SAME

RELATED APPLICATION

This application claims priority from Korean Patent Application No. 10-2013-0131503, filed on Oct. 31, 2013, in the Korean Intellectual Property Office, the disclosure of which is incorporated herein in its entirety by reference.

BACKGROUND

1. Field

Apparatuses consistent with exemplary embodiments relate to an apparatus for outputting directional light and a light interconnection system having the apparatus, and more particularly to an apparatus for outputting directional light, which is coupled to a light-emitting device to control the proceeding direction of the light, and a light interconnection system having the apparatus.

2. Description of the Related Art

Various types of optical elements interacting with light have been recently developed. The signal processing speed of an optical element using light is much faster than the signal processing speed of an electronic device. However, while the size of an electrical device can be decreased down to tens to hundreds of nanometers, it is difficult to manufacture an optical element with a size that is less than about several micrometers because of the light diffraction characteristic which limits the size of an optical element to less than or equal to a wavelength of light used therewith. Accordingly, there are limits to manufacturing integrated optical circuits using optical elements. Also, an optical device outputting a light beam with a Lambertian profile requires an optical element, such as a lens or a mirror, in order to control the light proceeding direction. In this case, the size of the optical device increases significantly, and thus it is difficult to integrate the optical device into a micro-scale device.

SUMMARY

One or more exemplary embodiments may provide an apparatus for outputting directional light, which is coupled to a light-emitting device to control a direction in which light proceeds.

One or more exemplary embodiments may provide a light interconnection system having the apparatus for outputting directional light, which is coupled to a light-emitting device to control a direction in which light proceeds.

Additional exemplary aspects will be set forth in part in the description which follows and, in part, will be apparent from the description, or may be learned by practice of the presented embodiments.

According to an aspect of an exemplary embodiment, an apparatus for outputting directional light includes a light-emitting structure having a light-emitting layer that emits light; and an optical antenna layer disposed on the light-emitting structure, wherein the optical antenna layer includes a light feeder configured to resonate light output from the light-emitting layer, wherein the optical antenna layer includes a light reflector configure to reflect light output from the light feeder to have directivity, and wherein the light feeder and the light reflector are formed on a surface of the optical antenna layer.

The light feeder may be a slot that penetrates through the optical layer, and the light reflector may be a groove in the optical antenna layer.

The optical antenna layer may further include a light director for guiding the light output from the light feeder.

The light director may be a groove in the optical antenna layer.

At least one of the light feeder and the light reflector may have a nano size.

The light feeder and the light reflector may have a rectangular shape.

The light feeder may have a circular section.

The light reflector may have a curved shape that is concave toward the light feeder.

The light director may have a curved shape that is concave toward the light feeder.

The light-emitting structure may include a first semiconductor layer disposed under the light-emitting layer and a second semiconductor layer disposed above the light-emitting layer.

The optical antenna layer may be an electrode.

The light-emitting layer may include a quantum dot or a fluorescent layer.

The optical antenna layer may be formed of metal.

The optical antenna layer may be formed of at least one metal selected from the group consisting of Ti, Au, Ag, Pt Cu, Al, Ni, and Cr.

At least one of the light feeder and the light reflector may have a size which is smaller than a wavelength of the light output from the light-emitting layer. The optical antenna layer may have a plurality of optical antenna units, wherein each of the optical antenna units may include the light feeder and the light reflector.

According to an aspect of another exemplary embodiment, an optical interconnection system includes a light-emitting structure having a light-emitting layer that emits light; a light-transmitting portion provided on the light-emitting structure and outputting directional light; and a light-receiving portion spaced apart from the light-transmitting portion, wherein the light-receiving portion receives light transmitted from the light-transmitting portion, wherein at least one of the light-transmitting portion and the light-receiving portion comprises an optical antenna layer, wherein that the optical antenna layer includes a light feeder configured to resonate light output from the light-emitting layer and a light reflector configured to reflect light output from the light feeder to have directivity, and wherein the light feeder and the light reflector are formed on a surface of the optical antenna layer.

The light feeder may be a slot that penetrates through the optical layer, and the light reflector may be a groove in the optical antenna layer.

The optical antenna layer may further include a light director that guides the light output from the light feeder.

The light director may be a groove in the optical antenna layer.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
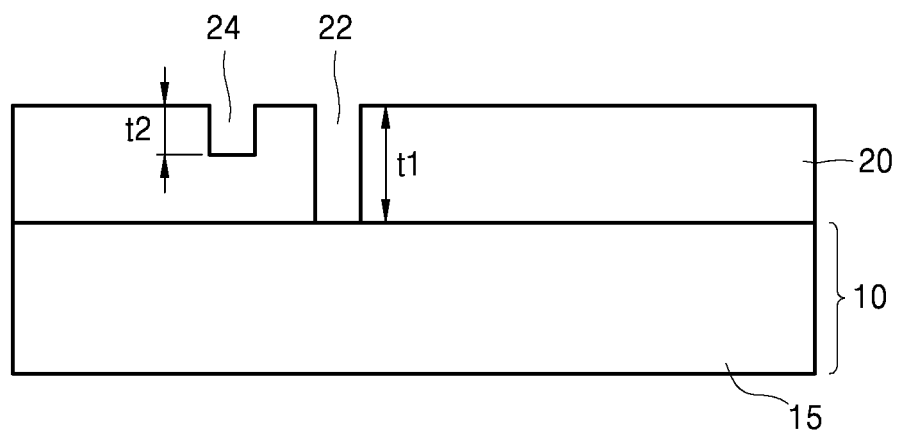
FIG. 1 schematically illustrates an apparatus for outputting directional light, according to an exemplary embodiment.

Reference will now be made in detail to embodiments, examples of which are illustrated in the accompanying drawings, wherein like reference numerals refer to like elements throughout. In the drawings, the thicknesses of layers and regions are exaggerated for clarity. In this regard, the present embodiments may have different forms and should not be construed as being limited to the descriptions set forth herein. Accordingly, exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

FIG. 1 schematically illustrates an apparatus for outputting directional light according to an exemplary embodiment. The apparatus for outputting directional light may include a light-emitting structure 10 and an optical antenna layer 20 disposed on the light-emitting structure 10. The light-emitting structure 10 may include a light-emitting layer 15 for emitting light. As an example, the light-emitting structure 10 may include a laser, a light emitting diode (LED), a fluorescent layer, or a quantum dot.

The optical antenna layer 20 may include a light feeder 22 and a light reflector 24. The light feeder 22 may have a resonance structure that resonates the light provided from the light-emitting layer 15. For example, the light feeder 22 may be in the shape of a slot penetrating through the optical antenna layer 20. The optical antenna layer 20 may be formed of a metal layer. For example, the optical antenna layer 20 may be formed of at least one metal selected from the group consisting of Ti, Au, Ag, Pt Cu, Al, Ni, and Cr. The optical antenna layer 20 may be formed of an alloy of at least two metals selected from the group consisting of Ti, Au, Ag, Pt Cu, Al, Ni, and Cr. However, the material for the optical antenna layer 20 is not limited thereto. The optical antenna layer 20 may be formed of metal so as to be used as an electrode. Accordingly, when the light-emitting structure 10 needs an electrode, the optical antenna layer 20 of the apparatus for outputting directional light may operate both as an electrode and an antenna. Since the light from the light-emitting layer 15 is resonated in the light feeder 22 and reflected by the light reflector 24 without resonance, the optical antenna layer 20 may be directly coupled to an upper portion of the light-emitting structure 10 and function as an antenna to provide the light output into a desired direction. Accordingly, the optical antenna layer 20 may be manufactured by employing the same manufacturing process of a light-emitting structure without requiring additional manufacturing equipment and/or processes.

The optical antenna layer 20 may have a thickness of, for example, tens or hundreds of nanometers. However, exemplary embodiments are not limited thereto, and the thickness of the optical antenna layer 20 may be determined based on its desired function as an optical antenna in an application.

Figure 2:
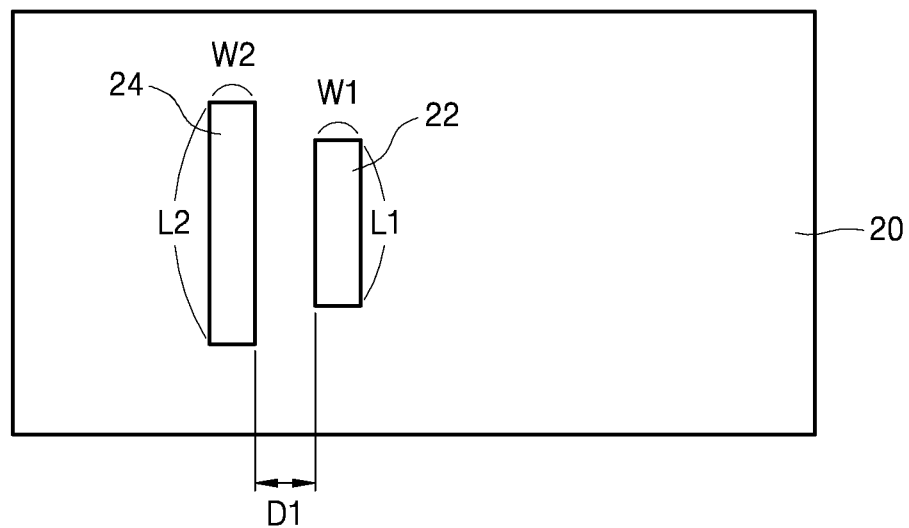
FIG. 2 is a plan view of the apparatus of FIG. 1.

The light feeder 22 and the light reflector 24 may be separated from each other on an upper surface of the antenna layer 20, as shown in FIG. 2. The light feeder 22 may have the shape of a slot penetrating through the optical antenna layer 20. The optical reflector 24 may have the shape of a groove formed in the optical antenna layer 20. While the light feeder 22 may have a shape of a slot that penetrates through the optical antenna layer 20, the light reflector 24 may be engraved on a surface of the optical antenna layer 20 without penetrating entirely through the optical antenna layer 20. Therefore, the light from the light-emitting structure 10 may be output only through the light feeder 22. Also, the light output from the light feeder 22 may have a single mode or multiple modes. For example, the multiple-mode light may be output from the light feeder 20 by adjusting the size of the light feeder 22 in order to increase the light efficiency or to use the apparatus for an application requiring multimode light.

Each of the light feeder 22 and the light reflector 24 may have, for example, a polygonal cross-sectional shape with different lengths, such that one side of the polygon may have a shorter length than that of another side Hereafter, the term of "long length" may refer to a length relatively longer than that of a "short length".

As illustrated in FIGS. 1 and 2, the light feeder 22 and the light reflector 24 may have, for example, rectangular shapes in both cross-sectional and plain views. The light feeder 22 may have a rectangular shape including a first side having a first depth t1, entirely through the optical antenna layer, a second side having a first short length W1, and a third side having a first long length L1. The light reflector 24 may have a rectangular shape including a first side having a second depth t2, a second side having a second short length W2, and a third side having a second long length L2. The first depth t1 of the light feeder 22 may be the same as a thickness of the optical antenna layer 20.

The first depth t1 is greater than the second depth t2. The first long length L1 may be the same as or different from the second long length L2. The first short length W1 and the second short length W2 may be the same or different. The first long length L1 may be relatively longer than the first short length W1. The second long length L2 may be relatively longer than the second short length W2.

As an example, a resonant wavelength of light may be selected by adjusting the first long length L1 of the light feeder 22. However, exemplary embodiments are not limited thereto, and the resonant wavelength of light may alternately be selected by adjusting at least one of the first long length L1, the first short length W1, the first depth t1 of the light feeder 22 and an interval D1 between the light feeder 22 and the light reflector 24. When the light-emitting structure 10 emits light, surface plasmon may be generated on a boundary surface between the light-emitting structure 10 and the optical antenna layer 20. Since the optical antenna layer 20 is formed of metal, the light interacts with electrons in the metal layer and generates the surface plasma when it is incident on the optical antenna layer 20. When the movement of the light matches with the movement of the electrons in the metal layer, electromagnetic energy of the incident light may be shifted to electron kinetic energy. An electromagnetic field generated due to the movement of electrons is referred to as plasmon, and the plasmon may exist on a surface of a metal layer. The incident light from the light-emitting structure 10 may be converted into surface plasmon in the metal layer, and the surface plasmon may move along the boundary surface between the light-emitting structure 10 and the optical antenna layer 20. The wavelength of the surface plasmon may be shorter than the wavelength of the incident light which is emitted from the light-emitting structure 10.

The surface plasmon may be generated on the boundary surface between the light-emitting structure 10 and the optical antenna layer 20 and may move along the boundary. A part of the surface plasmon may be converted back into light in at least one of the light feeder 22 and the light reflector 24 of the optical antenna layer 20. Thereby, surface plasmon may be output as light having directivity by interacting with the optical antenna layer 20.

For example, light may be output at the light feeder 22 where the light is resonated. The light reflector 24 may reflect the light from the light feeder 22 without resonating the light and may allow the light to have directivity. A direction of the light reflected by the light reflector 24 may be controlled by adjusting at least one of the size of the light reflector 24, the interval D1 between the light feeder 22 and the light reflector 24, and the size of the light feeder 22. The size may refer to one of a width, a length, a depth, and any combination thereof.

Although FIGS. 1 and 2 illustrate an example having only one light reflector 24, a plurality of light reflectors may be provided.

Figure 3:
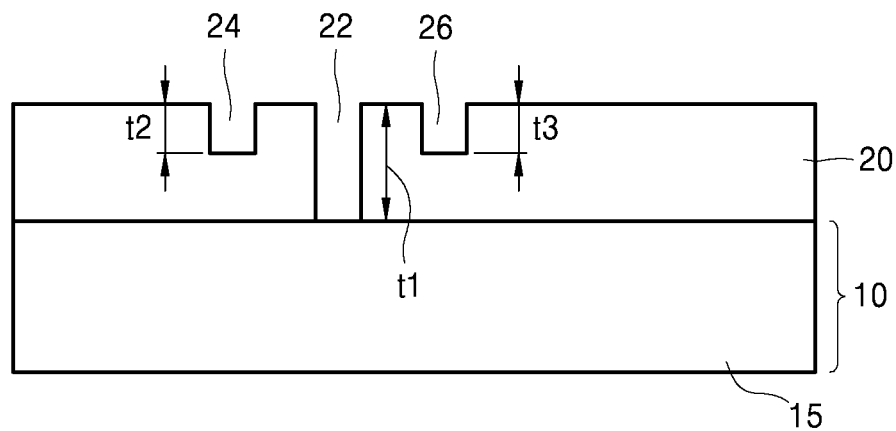
FIG. 3 illustrates an exemplary embodiment in which the apparatus of FIG. 1 further includes a light direction unit.
Figure 4:
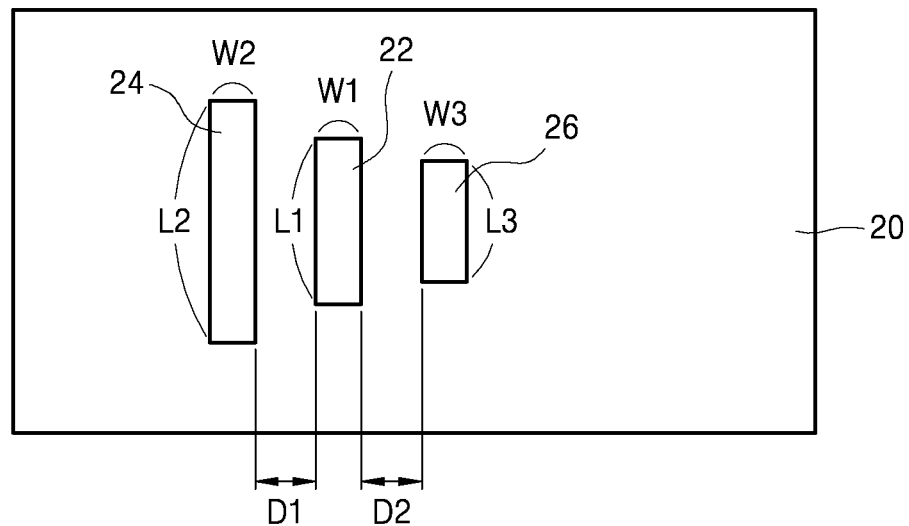
FIG. 4 is a plan view of the apparatus of FIG. 3.

According to the exemplary embodiment as illustrated in FIGS. 3 and 4, the optical antenna layer 20 of the apparatus may further include a light director 26. The light director 26 may guide the light output from the light feeder 22 and the light reflector 24. The light director 26 may be engraved on the surface of the optical antenna layer 20 without penetrating entirely through the optical antenna layer 20. The light feeder 22, the light reflector 24, and the light director 26 may have sizes in a nanometer scale. The size may refer to any one of a width, a length, a depth, a diameter, and any combination thereof. Alternatively, each of the light feeder 22, the light reflector 24, and the light director 26 may have a size that is smaller than the wavelength of the light to be emitted from the light-emitting layer 15.

As illustrated in FIGS. 3 and 4, the light director 26, like the light feeder 22 and the light reflector 24, may have, for example, a hexahedron shape. The hexahedron of the light director 26 includes a first side having a third depth t3, an second side having a third short length W3, and a third side having a third long length L3. The third depth t3 of the light director 26 may be smaller than the first depth t1 of the light feeder 22. The first, second, and third long lengths L1, L2, and L3 may have different sizes as shown in FIG. 4, or they may be the same. The first, second, and third short lengths W1, W2, and W3 may be the same or different. The third long length L3 is relatively longer than the third short length W3.

Figure 5:
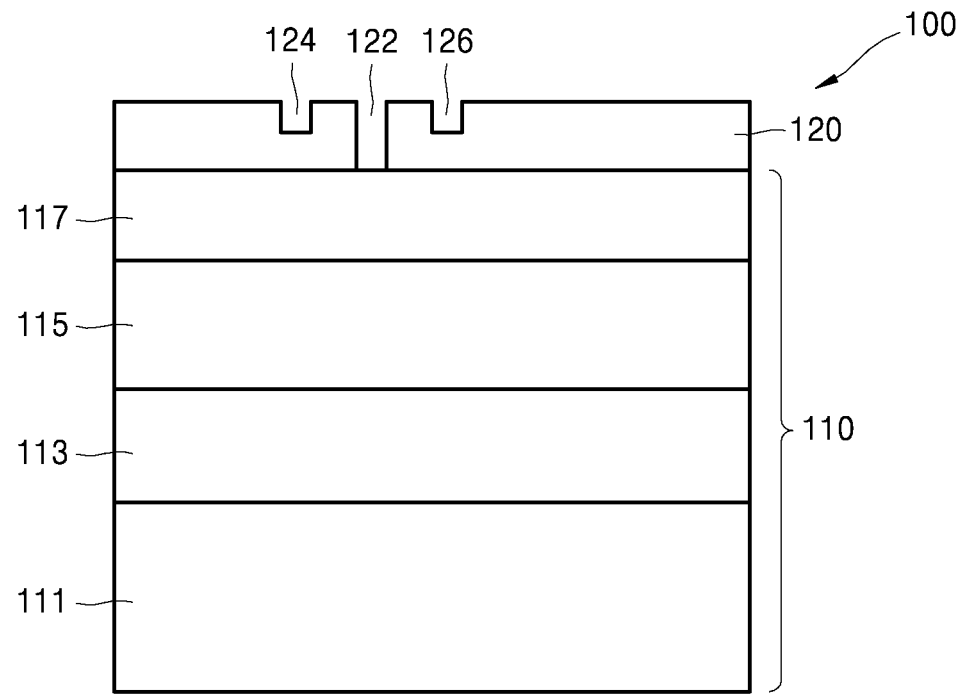
FIGS. 5 to 8 illustrate examples in which an apparatus for outputting directional light is applied to light-emitting devices.

FIG. 5 illustrates an exemplary embodiment in which an apparatus 100 for outputting directional light, is applied to a light-emitting device. Referring to FIG. 5, the apparatus 100 for outputting directional light may include a light-emitting structure 110 and an optical antenna layer 120 that gives directivity to the light emitted from the light-emitting structure 110.

The light-emitting structure 110 may include a substrate 111. A first semiconductor layer 113, a light-emitting layer 115 and a second semiconductor layer 117 may be disposed on the substrate 111 as shown in FIG. 5. The substrate 111 may be formed of, for example, a sapphire substrate or a silicon-based substrate. A silicon-based substrate may include, for example, a silicon (Si) substrate or a silicon carbide (SiC) substrate. The substrate 111 may be removed during a manufacturing process or after manufacturing is completed. The first semiconductor layer 113 may be doped into a first type, for example, a p type (or an n type), and the second semiconductor layer 117 may be doped into a second type, for example, an n type (or a p type).

The first and second semiconductor layers 113 and 117 may be formed of $Al_xIn_yGa_{1-x-y}N$ ($0 \leq x$, $y \leq 1$, $x+y<1$). The first and second semiconductor layers 113 and 117 may be formed of a V-III group semiconductor material, for example, a nitride semiconductor layer. The first semiconductor layer 113 may be formed of p-type GaN, and the second semiconductor layer 117 may be formed of n-type GaN. A p-type dopant may be at least one material selected from the group consisting of, for example, B, Al, Mg, Ca, Zn, Cd, Hg, and Ga. An n-type dopant may be at least one material selected from the group consisting of, for example, Si, In, and Sn.

The light-emitting layer 115 emits light by electron-hole recombination and is formed of, for example, an InGaN-based nitride semiconductor layer. A light-emitting wavelength band of the light-emitting layer 115 may be adjusted by controlling bandgap energy. The light-emitting layer 115 may have a quantum well structure including a quantum well layer and a barrier layer. For example, the light-emitting layer 115 may include a quantum well layer and a barrier layer that are formed of InGaN/GaN, InGaN/InGaN, InGaN/AlGaN, or InGaN/InAlGaN. The quantum well layer may include a single quantum well layer or a multi-quantum well layer.

The optical antenna layer 120 may include a light feeder 122, a light reflector 124, and a light director 126. The light feeder 122 may have a resonance structure that resonates the light output from the light-emitting layer 115. For example, the light feeder 122 may have the shape of a slot that penetrates through the optical antenna layer 120. The optical antenna layer 120 may be formed of a metal layer. Since the light feeder 122, the light reflector 124, and the light director 126 have substantially the same structure and operational characteristics as those described above with reference to FIGS. 1 to 4, additional detailed descriptions thereof will be omitted.

The optical antenna layer 120 may be used as an electrode of the light-emitting structure 110. In other words, the optical antenna layer 120 may function as an antenna and an electrode as well. Although it is not illustrated, another electrode may be further provided between the substrate 111 and the first semiconductor layer 113. Alternatively, when the substrate 111 is removed, an electrode may be additionally provided. In this case, it is also possible to arrange the optical antenna layer 120 at a bottom side of the first semiconductor layer 113 instead of positioning it above the second semiconductor layer 117. Furthermore, the optical antenna layer 120 may be provided for each of a surface of the first semiconductor layer 113 and a surface of the second semiconductor layer 117.

Since the optical antenna layer 120 may be stacked directly on the light-emitting structure 110, both a light-emitting structure and an optical antenna layer of an apparatus for outputting directional light having may be fabricated through a single unified manufacturing process. In exemplary embodiments, the light-emitting structure may have a structure with or without an electrode.

Figure 6:
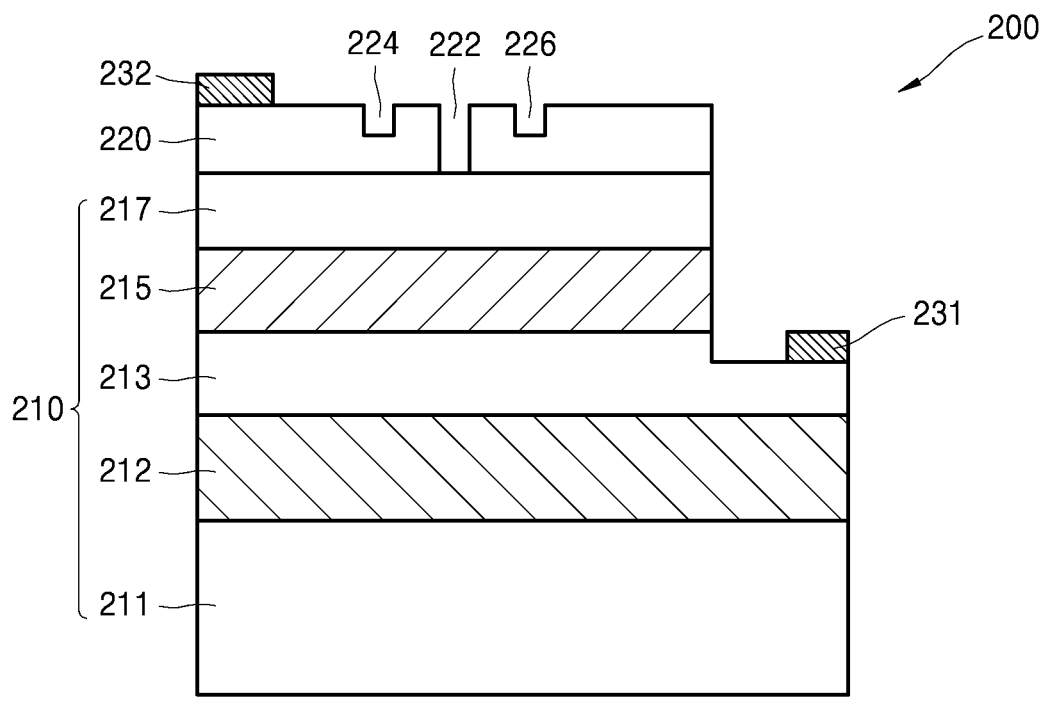

FIG. 6 illustrates an exemplary embodiment in which an apparatus 200 for outputting directional light is applied to a different type of a light-emitting device. Referring to FIG. 6, the apparatus 200 for outputting directional light may include a light-emitting structure 210 and an optical antenna layer 220 that gives directivity to the light emitted from the light-emitting structure 210.

The light-emitting structure 210 may include a substrate 211. A first semiconductor layer 213, a light-emitting layer 215, and a second semiconductor layer 217 may be disposed on the substrate 211, as shown in FIG. 6. The substrate 211 may be, for example, a sapphire substrate. The first semiconductor layer 213 may be doped into a first type, for example, a p type (or an n type), and the second semiconductor layer 217 may be doped into a second type, for example, an n type (or a p type). A third semiconductor layer 212 may be further provided between the substrate 211 and the first semiconductor layer 213. The third semiconductor layer 212 may be an undoped semiconductor layer.

The first to third semiconductor layers 213, 217, and 212 may be formed of $Al_xIn_yGa_{1-x-y}N$ ($0 \leq x$, $y \leq 1$, $x+y<1$). The first to third semiconductor layers 213, 217, and 212 may be formed of a V-III group semiconductor material, for example, a nitride semiconductor layer. Since the first and second semiconductor layers 213 and 217 are substantially the same as the first and second semiconductor layers 113 and 117 of FIG. 5, additional detailed description thereof will be omitted.

The light-emitting layer 215 may be formed of an InGaN-based nitride semiconductor layer. The light-emitting layer 215 may have a quantum well structure including a quantum well layer and a barrier layer. For example, the light-emitting layer 215 may include a quantum well layer and a barrier layer that are formed of InGaN/GaN, InGaN/InGaN, InGaN/AlGaN, or InGaN/InAlGaN. The quantum well layer may include a single quantum well layer or a multi-quantum well layer.

As illustrated in FIG. 6, a portion of the first semiconductor layer 213 may be exposed to the surrounding environment, and a first contact pad 231 may be provided on the exposed portion of the first semiconductor layer 213. A second contact pad 232 may be provided on a part of an upper surface of the optical antenna layer 220. A voltage may be supplied through the first contact pad 231 and the second contact pad 232. FIG. 6 illustrates an example of applying the apparatus for outputting directional light to a light-emitting device having a horizontal electrode structure.

The optical antenna layer 220 may include a light feeder 222, a light reflector 224, and a light director 226. The light feeder 222 may have a resonance structure that resonates the light output from the light-emitting layer 215. For example, the light feeder 222 may have the shape of a slot that penetrates through the optical antenna layer 220. The optical antenna layer 220 may be a metal layer. Since the light feeder 222, the light reflector 224, and the light director 226 have substantially the same structure and operational characteristics as those described above with reference to FIGS. 1 to 4, additional detailed descriptions thereof will be omitted.

Figure 7:
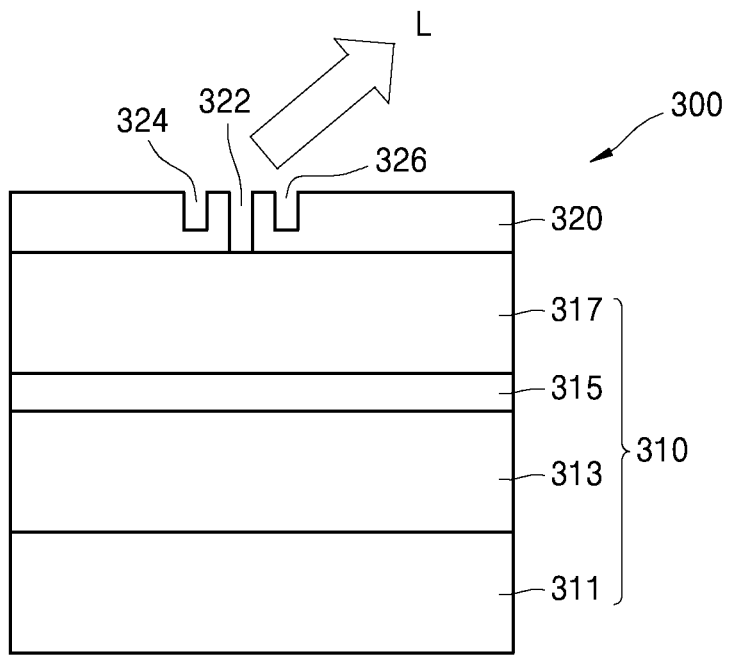

FIG. 7 illustrates an exemplary embodiment in which an apparatus 300 for outputting directional light is applied to a light-emitting device. Referring to FIG. 7, the apparatus 300 for outputting directional light may include a light-emitting structure 310 and an optical antenna layer 320 that gives directivity to the light emitted from the light-emitting structure 310.

The light-emitting structure 310 may include a hole transporting layer 313, a quantum dot layer 315, and an electron transporting layer 317. An electrode 311 may be provided under the hole transporting layer 313. The electrode 311 may be, for example, an anode electrode.

The optical antenna layer 320 may include a light feeder 322, a light reflector 324, and a light director 326. The optical antenna layer 320 may be used as an electrode. For example, the optical antenna layer 320 may be a cathode electrode. Since the light feeder 322, the light reflector 324, and the light director 326 have substantially the same structure and operational characteristics as those described above with reference to FIGS. 1 to 4, additional detailed descriptions thereof will be omitted.

When a current is supplied by using the electrode 311 and the optical antenna layer 320, holes are supplied to the quantum dot layer 315 through the hole transporting layer 313 and electrons are supplied to the quantum dot layer 315 through the electron transporting layer 317. For example, the hole transporting layer 313 may be formed of an organic material, and the electron transporting layer 317 may be formed of zinc oxide. The electrons and the holes meet in the quantum dot layer 315, to be excited, and light is emitted as they are recombined with each other. In the present exemplary embodiment, the quantum dot layer 315 may be a light-emitting layer. Light L emitted from the quantum dot layer 315 may have directivity as it passes through the optical antenna layer 320.

Figure 8:
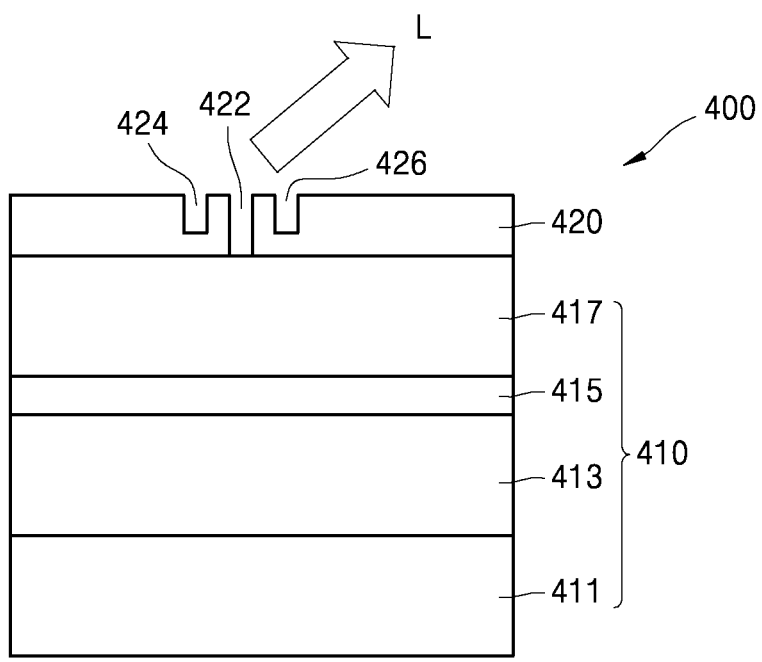

FIG. 8 illustrates an exemplary embodiment in which an apparatus 400 for outputting directional light is applied to a laser device. Referring to FIG. 8, the apparatus 400 for outputting directional light may include a light-emitting structure 410 and an optical antenna layer 420 that gives directivity to the light emitted from the light-emitting structure 410. The laser device may be, for example, a vertical cavity surface emitting laser (VCSEL).

The light-emitting structure 410 may include a first distribute Bragg reflector (DBR) layer 413, a light-emitting layer 415, and a second DBR layer 417. A contact layer 411 may be provided under the first DBR layer 413.

The optical antenna layer 420 may include a light feeder 422, a light reflector 424, and a light director 426. The optical antenna layer 420 may be used as an electrode of the light-emitting structure 410.

Since the light feeder 422, the light reflector 424, and the light director 426 have substantially the same structure and operational characteristics as those described above with reference to FIGS. 1 to 4, additional detailed descriptions thereof will be omitted.

The light-emitting layer 415 may have, for example, a multi-quantum well having a resonant periodic gain (RPG) structure. When pump light is emitted onto the light-emitting layer 415, light with a predetermined wavelength may be emitted due to the excitation occurring in the light emitting layer 415. The light emitted from the light-emitting layer 415 may be amplified by being repeatedly reflected between the first DBR layer 413 and the second DBR layer 417. The amplified light may be incident on the optical antenna layer 420. The light incident on the optical antenna layer 420 may be output with directivity through the optical antenna layer 420.

Figure 9:
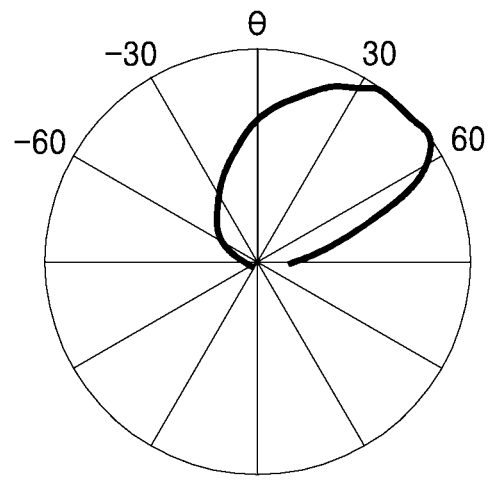
FIG. 9 illustrates a radiation pattern of an apparatus for outputting directional light.

FIG. 9 illustrates a radiation pattern of an apparatus for outputting directional light, according to an exemplary embodiment. For example, FIG. 9 illustrates a radiation pattern of an apparatus for outputting directional having a light feeder with a length of about 180 nm and a light reflector with a depth of about 150 nm. The light feeder and the light reflector are formed in an optical antenna layer formed of Ag and having a thickness of about 300 nm. The radiation pattern clearly shows that the apparatus for outputting directional light has directivity.

As described above, an apparatus for outputting directional light, according to any of the above-described exemplary embodiments, may be directly applied to a various types of light-emitting devices without an additional connection unit.

FIGS. 10 to 16 illustrate various examples of an optical antenna layer which may be employed to the apparatus for outputting directional light according to exemplary embodiments.

Figure 10:
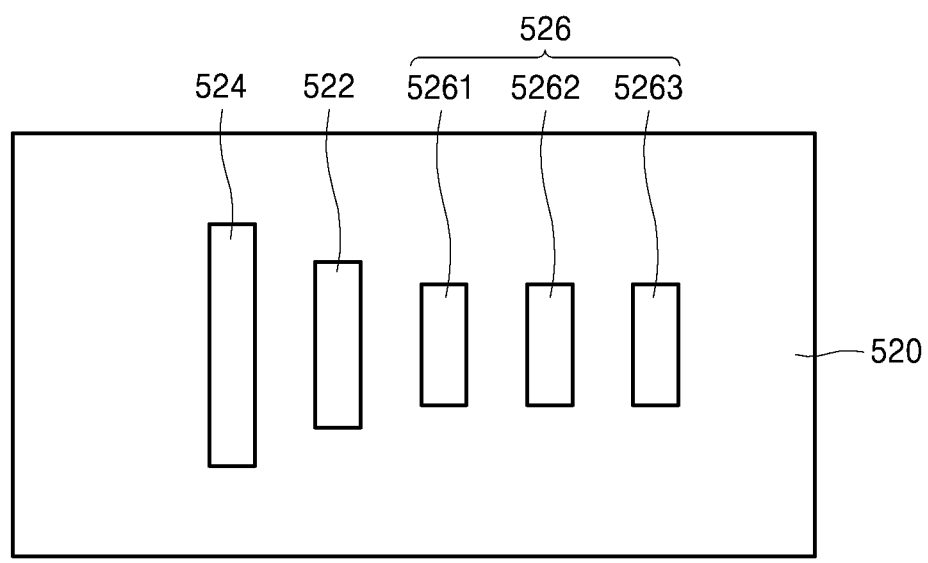
FIG. 10 illustrates an optical antenna layer of an apparatus for outputting directional light.
Figure 11:
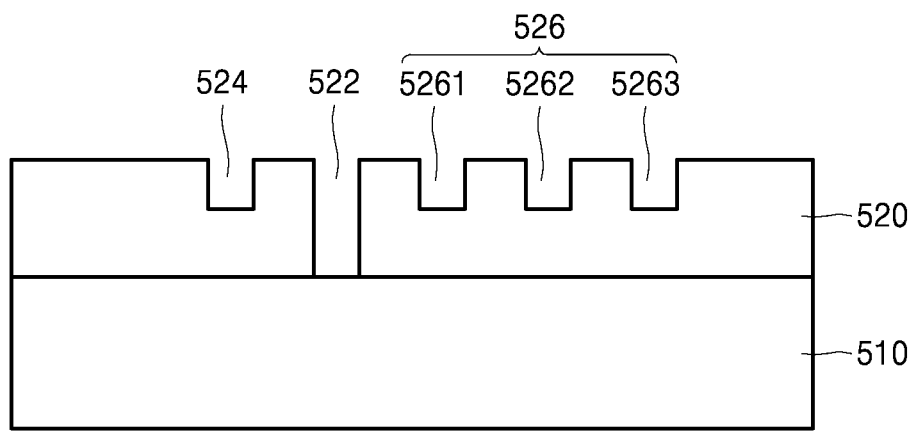
FIG. 11 is a schematic illustration of the optical antenna layer of FIG. 10.

The apparatus for outputting directional light illustrated in FIGS. 10 and 11 may include a light-emitting structure 510 and an optical antenna layer 520. The optical antenna layer 520 may include a light feeder 522, a light reflector 524, and a light director 526. The light director 526 may include plural light directors, for example, a first light director 5261, a second light director 5262, and a third light director 5263. Although the first through third light directors 5261, 5262, and 5263 may have the substantially same dimensions, as illustrated in FIGS. 10 and 11, exemplary embodiments are not limited thereto and the light director 526 may include a plurality of light directors having different sizes. In addition, although one light feeder 522 and one light reflector 524 are provided, it is also possible that either or both of the light feeder 522 and the light reflector 524 may be provided in multiple numbers. For light-emitting structure 510, the examples described with reference to FIGS. 5 to 8 may be applied.

Figure 12:
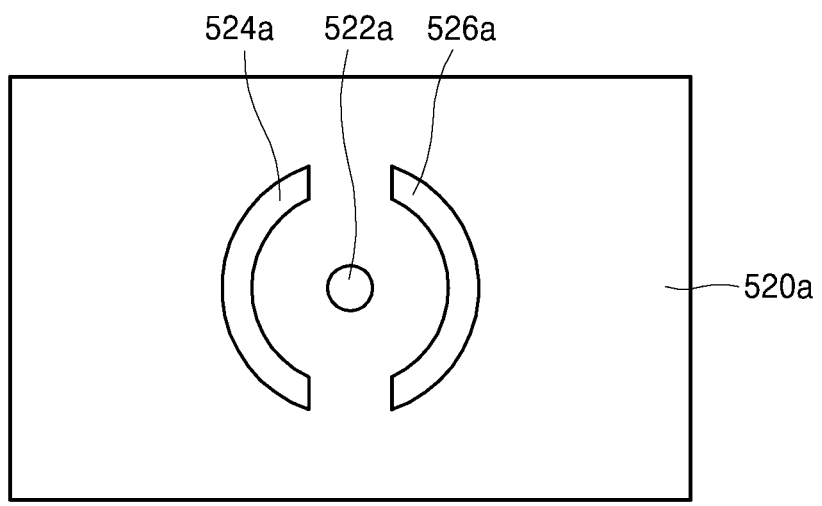
FIGS. 12 to 16 illustrate optical antenna layers of an apparatus for outputting directional light.

An optical antenna layer 520a shown in FIG. 12 may include a light feeder 522a, a light reflector 524a, and a light director 526a. The light feeder 522a may have a circular section. However, the shape of the light feeder 522a is not limited thereto, and the light feeder 522a may have an oval section, a rectangular section, or a polygonal section. The light feeder 522a may have a resonance structure having the shape of a slot that penetrates through the optical antenna layer 520a in a thickness direction. The light reflector 524a and the light director 526a may have the shape of grooves. Such structural characteristics may be substantially identically applied to the exemplary optical antenna layer embodiments described below.

The light reflector 524a may be arranged at one side of the light feeder 522a, and the light director 526a may be arranged at the other side of the light feeder 522a. The light reflector 524a and the light director 526a may be symmetrically arranged about the light feeder 522a, as shown in FIG. 12. The light reflector 524a and the light director 526a may have a curved shape. The light reflector 524a and the light director 526a may have a concave shape facing toward the light feeder 524a. For example, when the light reflector 524a and the light director 526a are connected by lines extending from each other, a circular shape or an oval shape may be formed.

Figure 13:
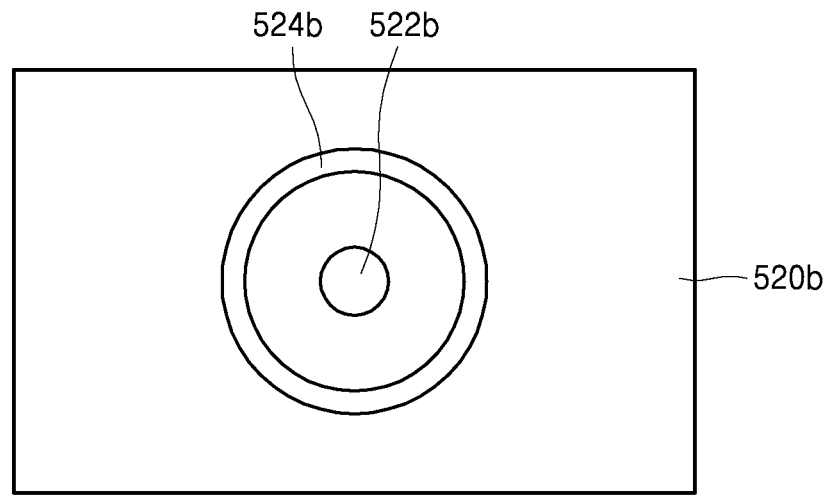

FIG. 13 illustrates an exemplary embodiment in which an optical antenna layer 520b may include a light feeder 522b and a light reflector 524b. The light feeder 522b may have a circular section. The light reflector 524b may be connected to the light feeder 522b. For example, the light reflector 524b may have a circular ring shape, and the light feeder 522b may be formed within the ring shaped light reflector 524b. In the exemplary embodiment, at least a part of the light reflector 524b may have a function of reflecting light, and at least one another part of the light reflector 524b may have the function of guiding the light in one direction.

Figure 14:
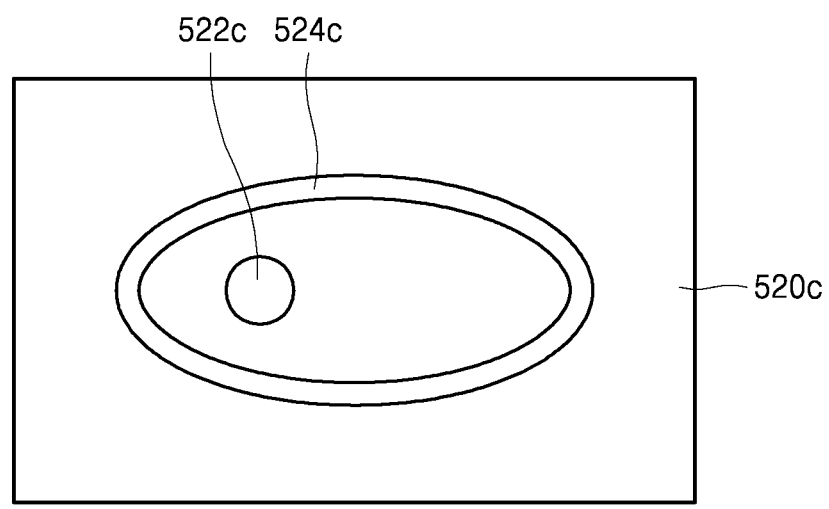

FIG. 14 illustrates an exemplary embodiment in which an optical antenna layer 520c may include a light feeder 522c and a light reflector 524c. The light feeder 522c may have, for example, a circular section. However, exemplary embodiments are not limited thereto. The light reflector 524c may have an oval ring shape. The light feeder 522c may be located at one of focal points of the oval of the light reflector 524c. In the exemplary embodiment, at least one part of the light reflector 524c may have a function of reflecting light, and at least one another part of the light reflector 524c may have a function of guiding the light in one direction. In other words, the light reflector 524c may be also used as a light director.

Figure 15:
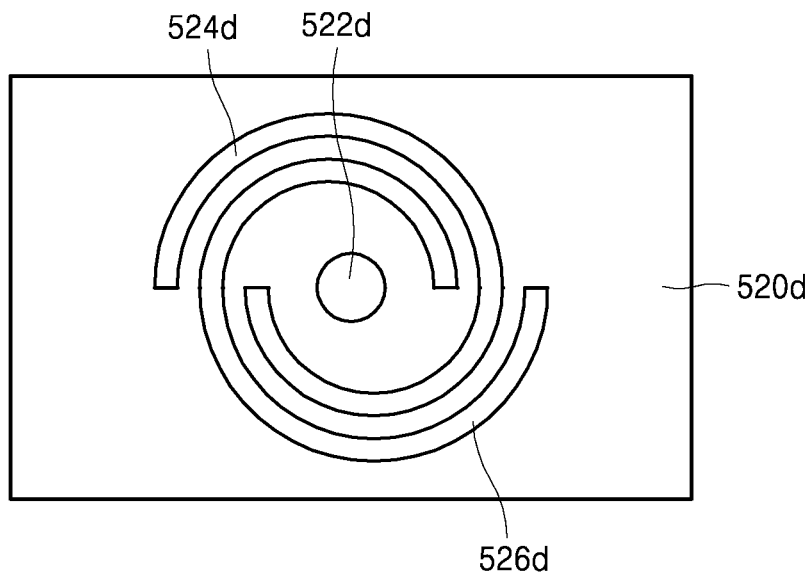

FIG. 15 illustrates an exemplary embodiment in which an optical antenna layer 520d may include a light feeder 522d, a light reflector 524d, and a light director 526d. The light feeder 522d may have, for example, a circular section. The light reflector 524d and the light director 526d may have a spiral groove shape.

Figure 16:
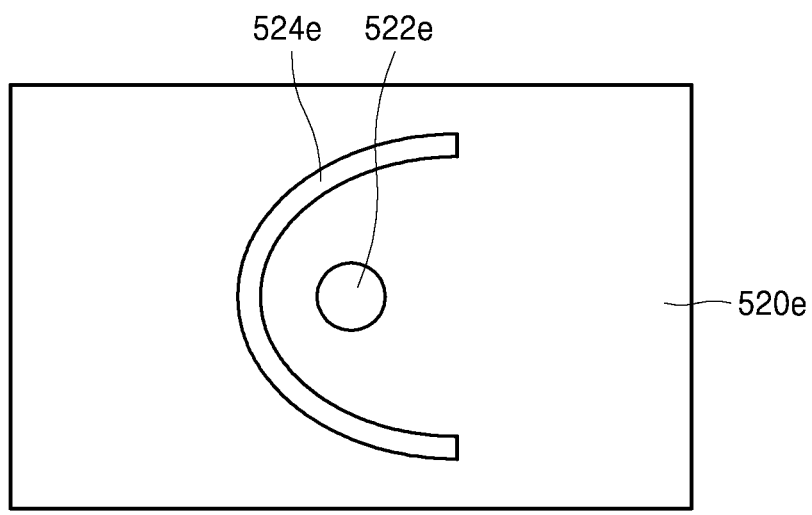

FIG. 16 illustrates an exemplary embodiment in which an optical antenna layer 520e may include a light feeder 522e and a light reflector 524e. The light feeder 522e may have, for example, a circular section. The light reflector 524e may have a curved shape. For example, the light reflector 524e may have a shape corresponding to a part of an oval. However, exemplary embodiments are not limited thereto. For example, when the light reflector 524e has a partial oval curved shape, the light feeder 522e may be located at one of focal points of the oval.

As described above, an optical antenna layer may be diversely modified within a range in which a light feeder has a resonance structure and a surface plasmon structure and a light reflector and a light director have the shape of grooves. Accordingly, the light feeder supplies light, and the light reflector and the light director may control a direction in which the light is output. Since the optical antenna layer may be directly coupled to a light-emitting device without an additional separate coupling member, the manufacturing of the apparatus is relatively easy and the apparatus may be embodied in one chip or one device. Therefore, the apparatus may be easily applied to any of various types of light-emitting devices. In addition, the apparatus may be used to receive and/or transmit an optical signal, and a highly integrated circuit may be configured by employing an apparatus according to one of the exemplary embodiments described herein.

Figure 17:
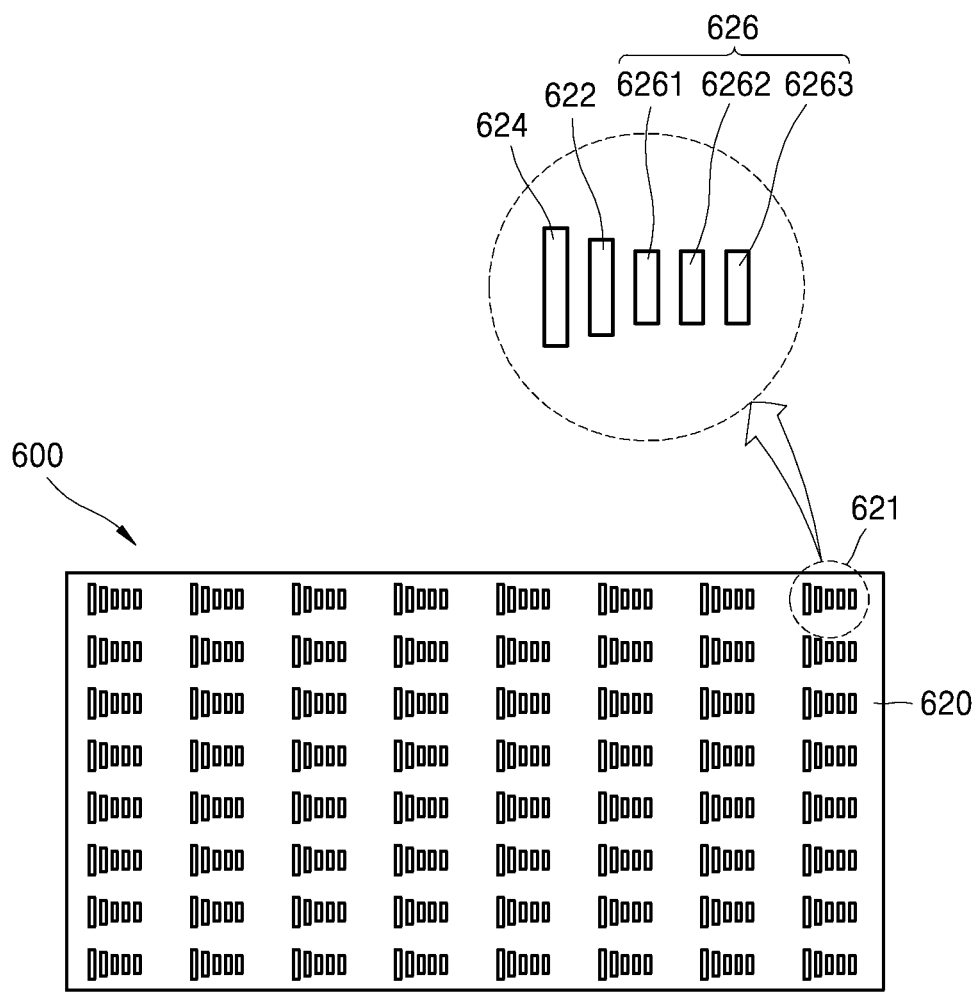
FIG. 17 illustrates an apparatus for outputting directional light.
Figure 18:
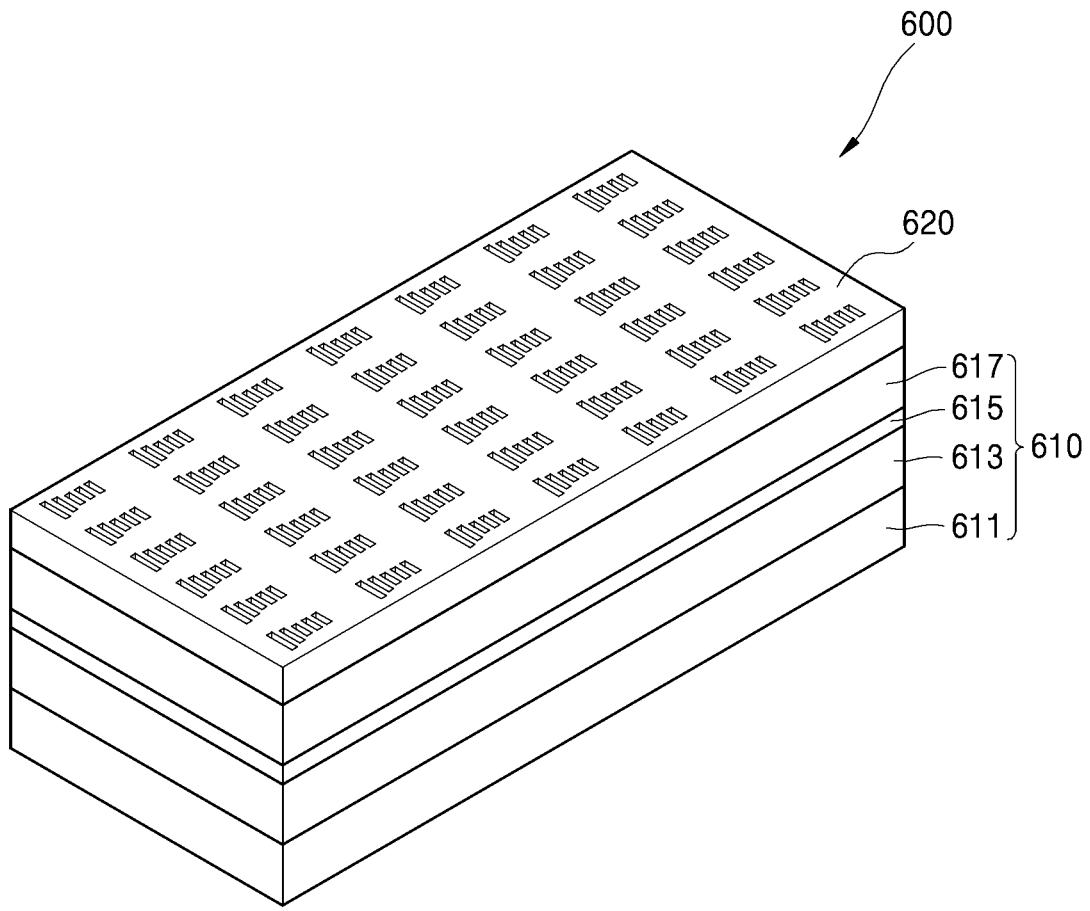
FIG. 18 is a perspective view of the apparatus of FIG. 17.

The optical antenna layer described above may be arranged in a form of an array. FIGS. 17 and 18 illustrate an exemplary embodiment in which an apparatus 600 for outputting directional light includes an array structure. The apparatus 600 for outputting directional light includes a light-emitting structure 610 and an optical antenna layer 620 for controlling a proceeding direction of the light output from the light-emitting structure 610. The optical antenna layer 620 may have an array structure in which a plurality of optical antenna units 621 are arranged.

The light-emitting structure 610 may have any structure that is capable of emitting light. For example, the light-emitting structure 610 may include a contact layer 611, a first nitride semiconductor layer 613, a light-emitting layer 615, and a second nitride semiconductor layer 617. The first nitride semiconductor layer 613 may be doped into a p type (or an n type), and the second nitride semiconductor layer 617 may be doped into an n type (or a p type). However, the doping of the first and second nitride semiconductor layers 613 and 617 may be selective based upon an application. The contact layer 611 may be an electrode.

Each of the optical antenna units 621 may include a light feeder 622, a light reflector 624, and a light director 626. The light director 626 may include first to third light directors 6261, 6262, and 6263, but this is only an example, and any optical antennas described previously, with any of various structures, may be employed.

The optical antenna layer 620 may also be used as an electrode. The optical antenna layer 620 having an array structure may increase the light emission efficiency.

Figure 19:
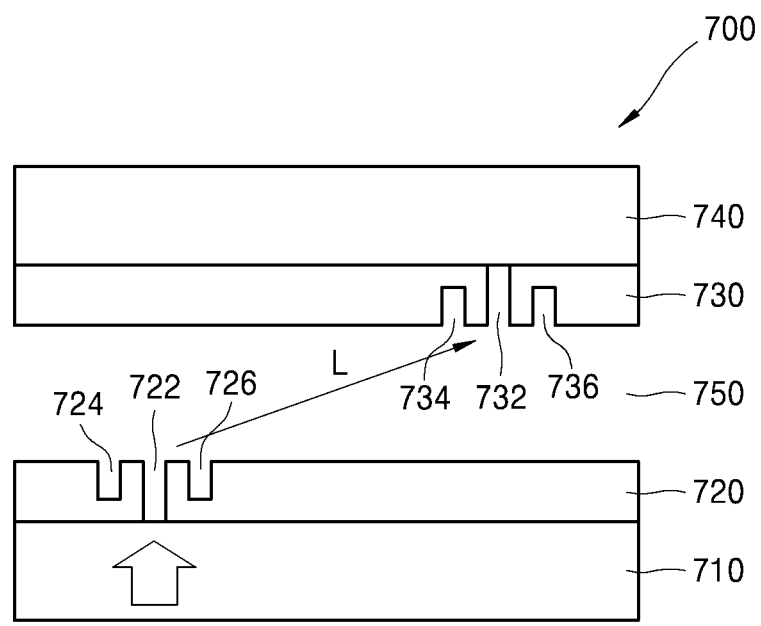
FIG. 19 schematically illustrates a light interconnection system including an apparatus for outputting directional light.

FIG. 19 schematically illustrates an optical interconnection system 700 according an exemplary embodiment. Referring to FIG. 19, the optical interconnection system 700 includes a light-emitting structure 710 and a light-receiving portion 730. A light-transmitting portion 720 may be provided on the light-emitting structure 710, and may output directional light. The light-receiving portion 730 may be arranged separated from the light-transmitting portion 720 and may receive light transmitted from the light-transmitting portion 720. A support substrate 740 may be further provided on a surface of the light-receiving portion 730.

The light-transmitting portion 720 may include an optical antenna layer that includes a light feeder 722 for resonating light provided from the light-emitting structure 710. The optical antenna layer may further include a light reflector 724 for reflecting the light output from the light feeder 722 to have directivity. In FIG. 19, the optical antenna layer and the light-transmitting portion are indicated with the same reference numeral. The light feeder 722 may have the shape of a slot that penetrates entirely through the optical antenna layer 720 in a thickness direction. The light reflector 724 may have the shape of a groove. In addition, the optical antenna layer 720 may further include a light director 726. Since the optical antenna layer 720 has substantially the same structure and operation characteristics as those described above with reference to FIGS. 1 to 18, additional detailed descriptions thereof will be omitted.

The light-receiving portion 730 may include a light feeder 732, a light director 734, and a light reflector 736. The light reflector 736 reflects light output from the light feeder 732 to have directivity. The light feeder 732 receives the light output from the light-transmitting portion 720.

The light-transmitting portion 720 and the light-receiving portion 730 may be spaced apart from each other. A space 750 between the light-transmitting portion 720 and the light-receiving portion 730 may be filled with air or a different material. For example, the light-transmitting portion 720 and the light-receiving portion 730 may be employed for layer to layer or chip to chip communications. Accordingly, a signal may be transmitted without a complicated wiring structure and at a high transmission speed, which is much faster than that in an electrical circuit, since the signal is transmitted at the speed of light. Therefore, the light transmitting and receiving portions may provide an optical interconnection which may simplify an integrated circuit and allow a multilayered integrated circuit.

It should be understood that exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope of the present inventive concept as defined by the following claims.

What is claimed is:

1. An apparatus for outputting a directional light, the apparatus comprising:
   a light-emitting structure comprising a light-emitting layer configured to emit light; and
   an optical antenna layer disposed on the light-emitting structure, the optical antenna layer comprising:
      a light feeder formed in a surface of the optical antenna layer and configured to resonate the light emitted from the light-emitting layer,
      a light reflector formed in the surface of the optical antenna layer and configured to reflect the light output from the light feeder, and
      a light director formed in the surface of the optical antenna layer and configured to guide the light output from the light feeder,
   wherein the light feeder is a slot which has a first long side and penetrates completely through the optical antenna layer,
   wherein the light reflector is a first groove which does not penetrate completely through the optical antenna layer,
   wherein the light director is a second groove which has a second long side having a length that is smaller than a length of the first long side of the light feeder,
   wherein the light reflector has a rectangular cross-section defined by four side walls and a rectangular opening defined by four edges on the surface in a plan view of the surface, the four edges corresponding to the four side walls, respectively, and
   wherein both the light feeder and the light reflector are disposed on the light-emitting structure.

2. The apparatus of claim 1, wherein at least one among the light feeder and the light reflector has a nano size.

3. The apparatus of claim 1, wherein the light feeder has a rectangular cross-section defined by four side walls and a rectangular opening defined by four edges on the surface in the plan view of the surface, the four edges corresponding to the four side walls, respectively.

4. The apparatus of claim 1, wherein the light-emitting structure comprises:
   a first semiconductor layer disposed under the light-emitting layer, and
   a second semiconductor layer disposed above the light-emitting layer,
   wherein the optical antenna layer is disposed on the second semiconductor layer.

5. The apparatus of claim 4, wherein the optical antenna layer is an electrode.

6. The apparatus of claim 1, wherein the light-emitting layer comprises one among a quantum dot and a fluorescent layer.

7. The apparatus of claim 1, wherein the optical antenna layer is formed of metal.

8. The apparatus of claim 7, wherein the optical antenna layer is formed of at least one metal among Ti, Au, Ag, Pt Cu, Al, Ni, and Cr.

9. The apparatus of claim 1, wherein at least one among the light feeder and the light reflector has a dimension which is smaller than a wavelength of the light emitted from the light-emitting layer.

10. The apparatus of claim 1, wherein the optical antenna layer comprises a plurality of optical antenna units,
the light feeder is included into a plurality of light feeders,
the light reflector is included into a plurality of light reflectors, and
each of the plurality of optical antenna units comprises a corresponding light feeder of the plurality of light feeders, and a corresponding light reflector, of the plurality of light reflectors.

11. The apparatus of claim 1, wherein the light feeder and the light reflector are disposed in a portion of the surface, the portion being disposed within the light-emitting layer in the plan view of the surface.

12. An optical interconnection system comprising:
a light-emitting structure comprising a light-emitting layer configured to emit light;
a light-transmitting portion disposed on the light-emitting structure and configured to transmit a directional light; and
a light-receiving portion, spaced apart from the light-transmitting portion,
wherein the light-receiving portion receives the directional light transmitted by the light-transmitting portion,
wherein at least one among the light-transmitting portion and the light-receiving portion comprises an optical antenna layer comprising:
a light feeder configured to resonate the light emitted by the light-emitting layer, and
a light reflector configured to reflect light output by the light feeder,
wherein the light output by the light reflector is the directional light,
wherein the light feeder and the light reflector are formed on a same surface of the optical antenna layer,
wherein the light feeder is a slot which penetrates through the optical antenna layer, and the light reflector is a first groove which does not penetrate through the optical antenna layer, and
wherein both the light feeder and the light reflector are disposed on the light-emitting structure.

13. The optical interconnection system of claim 12, wherein the optical antenna layer further comprises a light director that guides the light output by the light feeder.

14. The optical interconnection system of claim 13, wherein the light director is a second groove in the optical antenna layer.

15. A directional light transmitter comprising:
a light-emitting structure configured to output light; and
an optical antenna layer comprising an electrode, a light feeder comprising a slot which is formed to completely penetrate the electrode and has a first long side, a light reflector comprising a first groove in a surface of the electrode, and a light director comprising a second groove which is formed in the surface of the electrode and has a second long side having a length smaller than a length of the first long side of the light feeder,
wherein both the light feeder and the light reflector are disposed on the light-emitting structure, and
wherein the light reflector has a rectangular cross-section defined by four side walls and a rectangular opening defined by four edges on the surface in a plan view of the surface, the four edges corresponding to the four side walls, respectively.

* * * * *